United States Patent [19]

Fryd et al.

[11] Patent Number: 4,975,484
[45] Date of Patent: Dec. 4, 1990

[54] ACRYLIC COPOLYMER COMPOSITION AND ADHESIVE COATINGS THEREFROM

[75] Inventors: Michael Fryd, Moorestown, N.J.; Walter E. Pye, Wilmington, Del.; Richard D. Redfearn, Haddon Heights, N.J.

[73] Assignee: E. I. Du Pont de Nemours and Company, Wilmington, Del.

[21] Appl. No.: 376,195

[22] Filed: May 1, 1989

Related U.S. Application Data

[63] Continuation of Ser. No. 14,248, Feb. 11, 1987, abandoned, which is a continuation-in-part of Ser. No. 923,917, Oct. 28, 1986, abandoned, which is a continuation of Ser. No. 732,787, May 10, 1985, abandoned.

[51] Int. Cl.$^5$ ............................................. C08L 37/00
[52] U.S. Cl. ........................................ 524/811; 526/273
[58] Field of Search ........................... 524/811; 526/273

[56] References Cited

U.S. PATENT DOCUMENTS

| | | | |
|---|---|---|---|
| 3,223,670 | 12/1965 | Cantor et al. | 260/29.6 |
| 3,336,149 | 8/1967 | Fox et al. | 117/25 |
| 3,350,339 | 10/1967 | Sekmakas | 260/29.6 |
| 3,418,295 | 12/1968 | Schoenthaler | 260/80.72 |
| 3,418,392 | 12/1968 | Leitner | 260/834 |
| 3,448,089 | 6/1969 | Celeste | 260/78.5 |
| 3,728,150 | 4/1973 | Yuan | 117/138.8 |
| 3,729,338 | 4/1973 | Lehman et al. | 117/122 |
| 3,736,279 | 5/1973 | Camelon et al. | 260/21 |
| 3,758,634 | 9/1973 | Labana et al. | 260/836 |
| 3,787,520 | 1/1974 | Labana et al. | 260/836 |
| 3,810,859 | 3/1974 | Mikofalvy | 260/29.6 |
| 3,822,175 | 7/1974 | Yuan | 161/93 |
| 3,900,662 | 8/1974 | Yuan | 428/252 |
| 3,954,898 | 5/1976 | Hirota et al. | 260/837 |
| 3,959,404 | 5/1976 | Labana et al. | 260/830 |
| 4,042,645 | 8/1977 | Hirota et al. | 260/830 |
| 4,076,675 | 2/1978 | Sommerfeld | 260/29.4 |
| 4,098,952 | 7/1978 | Kelly et al. | 428/483 |
| 4,312,916 | 1/1982 | Kakumaru et al. | 428/345 |
| 4,323,659 | 4/1982 | Watanabe et al. | 525/108 |
| 4,378,450 | 3/1983 | Ema et al. | 525/139 |
| 4,404,324 | 9/1983 | Fock et al. | 525/123 |
| 4,435,543 | 3/1984 | Ema et al. | 525/143 |

FOREIGN PATENT DOCUMENTS

| | | | |
|---|---|---|---|
| 2420683 | 11/1974 | Fed. Rep. of Germany . | |
| 2519589 | 11/1975 | Fed. Rep. of Germany | 524/811 |
| 3128062 | 2/1983 | Fed. Rep. of Germany | 524/811 |
| 7028999 | 9/1970 | Japan | 524/811 |
| 55-045732 | 3/1980 | Japan | 524/811 |
| 0761928 | 11/1956 | United Kingdom | 524/811 |
| 1459843 | 12/1976 | United Kingdom . | |
| 2123010 | 1/1984 | United Kingdom . | |

*Primary Examiner*—Joseph L. Schofer
*Assistant Examiner*—T. M. Reddick

[57] ABSTRACT

An improved adhesive composition comprising a non-acidic aqueous latex copolymer of a lower acrylate, an acrylic nitrile and a glycidyl acrylate having a crosslinking agent dissolved in the aqueous phase.

3 Claims, No Drawings

ACRYLIC COPOLYMER COMPOSITION AND ADHESIVE COATINGS THEREFROM

CROSS REFERENCE TO RELATED APPLICATION

This application is a continuation of application Ser. No. 07/014,248 filed Feb. 11, 1987, now abandoned, which is a continuation-in-part of copending application Ser. No. 923,917, filed Oct. 28, 1986, now abandoned, which is a continuation of application Ser. No. 732,787, filed May 10, 1985 and now abandoned.

FIELD OF INVENTION

The invention relates to acrylic latex copolymer compositions and to adhesive coatings made therefrom.

BACKGROUND OF THE INVENTION

The flexible circuit industry requires adhesives for polyimide film and copper which can withstand elevated temperatures and a variety of harsh solvents and chemicals. During the many preparation and processing steps for circuit manufacture, these solvents and chemicals can cause an adhesive to swell. This swelling leads to blister formation and/or delamination, which results in reduced circuit yields. The application of heat, such as in soldering, can similarly cause circuit failures. In preparing multilayer flexible circuits, manufacturers need adhesive-coated polyimide films which can effectively encapsulate patterned metal circuits and also provide a planar surface for subsequent lamination.

PRIOR ART

Crosslinkable acrylic adhesive compositions which bond to caustic treated polyimide elements are known from U.S. Pat. Nos. 3,822,175; 3,900,662 and 3,728,150. U.S. Pat. Nos. 3,336,149 and 3,418,392 disclose acrylic adhesive compositions which can be cured for bonding to textile fibers. Combinations of phenolic resins and acrylic copolymers for adhesive compositions are known from U.S. Pat. Nos. 4,435,543 and 3,376,279. A curable adhesive composition comprising 25 to 64.8% acrylate, 20 to 40% acrylonitrile and 0.2 to 5% glycidyl methacrylate is described in U.S. Pat. No. 4,404,324, whereas U.S. Pat. No. 4,098,952 describes 3 to 25% glycidyl methacrylate. Adhesive compositions incorporating acrylics and phenolic resins are described with different ranges of glass transition temperature in U.S. Pat. Nos. 3,758,634; 3,954,898; 4,312,916 and 4,378,450. Other uses of acrylic adhesives are described in U.S. Pat. Nos. 3,729,338; 3,787,520; 3,959,404; 4,042,645; 4,076,675 and 4,323,659.

In spite of the extensive work directed to curable adhesive compositions containing acrylic copolymers and phenolic resins, a need still exists for such adhesives having improved encapsulation and flow properties as well as chemical and thermal stability.

BRIEF DESCRIPTION OF THE INVENTION

The invention is directed in one aspect to a latex copolymer prepared by free radical-initiated aqueous emulsion polymerization of a mixture of nonacidic monomers comprising 50–60 wt. % lower alkyl acrylate, 30–40 wt. % acrylonitrile methacrylonitrile or mixtures thereof and 5–12 wt. % glycidyl acrylate, glycidyl methacrylate or mixtures thereof, having a glass transition temperature ($T_g$) of 0°–55° C. and a weight average molecular weight ($\overline{M}_w$) of 150,000–1,000,000.

In a second aspect, the invention is directed to an adhesive coating composition comprising
(a) 90–99 wt. % of the above-described latex copolymer and
(b) 10–1 wt. % of a water-soluble crosslinking agent.

In a third aspect, the invention is directed to an adhesive film prepared by (1) applying a layer of the above-described adhesive coating to a substrate, (2) drying the composition at a temperature below the crosslinking temperature of the crosslinking agent and (3) heating the dried layer above the crosslinking temperature of the crosslinking agent to effect crosslinking thereof.

DETAILED DESCRIPTION OF THE INVENTION

A. Latex Copolymer

As noted above, the latex copolymer component of the invention is prepared by free radical-initiated aqueous emulsion polymerization of a mixture of nonacidic monomers comprising 50–60 wt. % lower alkyl acrylate, 30–40 wt. % acrylonitrile, methacrylonitrile, or mixtures thereof, and 5–12 wt. % glycidyl acrylate, glycidyl methacrylate or mixtures thereof. The resulting copolymer must have a $T_g$ of 0°–55° C. and $\overline{M}_w$ of 150,000–1,000,000.

As used herein, the term "lower alkyl" means $C_{1-4}$ alkyl groups.

When it is desired to have a low flow (high viscosity) composition, it is preferred that $\overline{M}_w$ of the copolymer be 750,000–1,000,000. On the other hand, when it is desired to have a high flow (low viscosity) composition, it is preferred that $\overline{M}_w$ of the copolymer be 150,000–450,000. Such latex copolymers can be made by conventional latex polymerization techniques such as those disclosed by Sanderson in U.S. Pat. No. 3,032,521, which is incorporated herein by reference.

A preferred low flow copolymer is a latex copolymer of 35/55/10 by weight acrylonitrile/butyl acrylate/glycidyl methacrylate having a $T_g$ of 40° C. and $\overline{M}_w$ of 800,000. A preferred high flow copolymer is one of the same monomer composition, the $\overline{M}_w$ of which is only 300,000.

The latex copolymer of the invention exhibits improved adhesion and thermal stability in comparison to prior art latices used to prepare adhesives. The following comparison illustrates the advance provided by the invention using alkyl acrylate/acrylonitrile latex copolymer with the indicated functional comonomer additions.

| COMONOMER ADDITION (1) | THERMAL STABILITY (2) | ADHESION (PSI) (3) |
| --- | --- | --- |
| MAA | 440° F. | BELOW 2 |
| HEMA | 500° F. | BELOW 2 |
| MAA/GMA (50/50) | 400° F. | BELOW 2 |
| GMA | 550° F. | 4–6 |

(1) Latex Produced comprising 35% acrylonitrile/-55% ethyl acrylate/10% indicated comonomer(s).
(2) Maximum temperature at which latex composition was not damaged after a 5 minute test exposure.
(3) Force required to peel a layer of the latex composition away from a polyimide support.

In view of the very poor thermal stability of a latex containing a mixture of methacrylic acid and glycidylmethacrylate, the discovery that complete elimination of acid and substitution of GMA therefore gave superior results went against all conventional knowledge in the art. All prior work had shown that efforts to lower or change the acid content of the latex copolymer had given poorer results.

B. Crosslinking Agent

The above-described latex copolymers are used in conjunction with 1-10% wt. of a water-soluble crosslinking agent such as melamine formaldehyde, phenol formaldehyde, urea formaldehyde and the like. These crosslinkers are present in an amount of about 1-10% by weight of terpolymer. A polyvinyl alcohol thickener can be used to vary viscosity.

The composition may contain surface tension and viscosity control agents as well as fillers, colorants and flame retardant additives. In particular, 95% latex copolymer is combined with 5% phenol formaldehyde resin to provide a preferred adhesive composition to which about 0.5% by weight polyvinyl alcohol of molecular weight above 100,000 is added as a thickener. Other compatible thickening agents can be employed to facilitate film formation prior to drying.

C. Dispersing Medium

In most instances, it will be preferred to use the aqueous phase of the copolymer latex as the dispersing medium for the adhesive composition of the invention. However, if desired, the acrylic adhesive can be contained as a dispersion or dissolved in a suitable organic liquid or mixtures of organic liquids. Examples of these are aromatic hydrocarbons such as toluene and xylene; aliphatic hydrocarbons such as hexane and octane; esters such as ethyl acetate; ketones such as methyl ethyl ketone and methylisobutyl ketone; and ethers such as monoalkylethers of ethylene glycol. Examples of suitable organic liquids are disclosed in U.S. Pat. No. 3,032,521.

D. Formulation and Application

The adhesive composition can be prepared in an unsupported form by application to a release substrate such as coated paper or application onto polyimide films and/or metal sheets and the like. Polyimides suitable for use as substrates in this invention are disclosed in Edwards U.S. Pat. No. 3,179,634, the disclosure of which is hereby incorporated by reference.

The polyimide or other substrate may contain reinforcing and/or filler material, for example natural or synthetic fibers such as fiberglass, boron, polyester, polyamide, acrylic, Nomex ® and Kevlar ®, aromatic polyamides, nylon, etc. Woven or nonwoven fabrics made from natural or synthetic fibers such as those mentioned above can also be used. Particular filler materials include silica, silicates, carbon black, carbonates, metals and metal oxides, such as magnesium oxide calcium oxide aluminum oxides etc. The composition may also contain flame retardant materials, such as antimony oxides and/or brominated or chlorinated phosphates, for example, tris-(2,3-dibromopropyl) phosphate.

The acrylic adhesive composition can be applied to the substrate film by conventional application procedures such as spraying, drying, printing, brushing, extrusion, dip coating roll coating and the like. If desired the acrylic adhesive can contain reinforcing and/or extender material such as those primarily enumerated as being suitable for the polyimide film.

In particular the adhesive composition can be applied to Kapton ® polyimide film or used as a bonding medium between Kapton ® polyimide film and copper. The adhesive composition can be stored in roll form using coated paper or Mylar ® film.

The acrylic adhesive can be applied to the polyimide film or other substrate in varying thickness depending on the desired end use.

The acrylic adhesive-coated polyimide films can be adhered to suitable substrates to form laminates. Suitable substrates include metal and especially metal foils of copper, copper alloys, silver, silver alloys, gold, gold alloys; woven and nonwoven fabrics made from natural or synthetic fibers such as glass, boron, polyester, polyamide, acrylic, etc.; woven and nonwoven fabric impregnated with resin such as polyimide, polyamide, epoxy, acrylic; paper of natural or synthetic fibers such as Nomex ® nylon paper, etc.; and film of polymer such as polyimide, polyamide, polyester, acrylic, epoxy, polyurethane, etc. Preferred substrates include metal and especially copper, polyimide film, polyamide paper, woven and nonwoven glass fabric, and polyimide or epoxy impregnated glass fabric.

Various techniques can be used to join material surfaces using the adhesive films of the invention. For example when the film has been applied to a release support such as Mylar ® polyester film or polymer coated paper, two materials can be joined by applying the exposed layer of the adhesive film to one of the materials, peeling off the substrate support from the adhesive film, thus exposing a second surface of the adhesive, and then laminating the second layer of material to the exposed surface of the adhesive film under pressure and heat sufficient to effect crosslinking of the crosslinking agent in the adhesive film On the other hand when the adhesive film is applied to a nonrelease support, e.g., a polyimide film the polyimide film can be joined to a second material such as a printed circuit board by laminating the polyimide-coated adhesive film to the second material under heat and pressure sufficient to initiate and effect complete crosslinking of the crosslinking agent.

Standard lamination procedures can be used to make the laminates such as vacuum bag lamination, press lamination, roll lamination, etc. The laminates are useful as circuit boards, structural members and the like.

E. Test Methods

1. The method used for determining the weight average molecular weight ($\overline{M}_w$) is gel permeation chromatography. The analytical procedure consisted of dissolving 1% wt. polymer in tetrahydrofuran (THF) and chromatographing a sample on a Shodex ® 50620 column versus two polymethylmethacrylate (PMMA) standards having $\overline{M}_w$'s of 23,700 and 150,700.

2. Standard IPC tests used in this work were: Peel Strength IPC-TM-650 method 2.4.9, Flow Max. (squeeze out in mils) IPC-TM-650 method 2.3.17.1 and solder Float IPC-TM-650 method 2.4.13. Resistance to various caustic and chemical baths was measured at various temperatures by placing a test sample in a bath and observing when adhesive failure occurred, or by placing the sample in a bath for a set time period such as 15 minutes and removing it to check if any signs of failure had begun.

EXAMPLE 1

(Low Flow Terpolymer)

In a 2 liter flask equipped with a mechanical stirrer, condenser, two addition funnels, a thermometer and nitrogen inlet were placed 380 g of deionized water, 16.4 g of acrylonitrile, 28.2 g of butyl acrylate, 2.3 g of glycidyl methacrylate and 0.01 g of ferric ammonium sulfate. This mixture was heated with stirring under a nitrogen atmosphere. When the temperature reached 75° C. an initiator solution of 0.02 g of sodium metabisulfite, and 0.09 g of ammonium persulfate in 14.8 g of deionized water was added to the flask. The reaction mixture turned almost instantly into a blue-white emulsion. Immediately after addition of the initiator solution two separate feeds were begun simultaneously. The first, a monomer feed consisting of a mixture of 147.9 g of acrylonitrile, 253.5 g of butyl acrylate and 21.1 g of glycidyl methacrylate was added to the reaction mixture over 140 minutes. The second, an initiator and surfactant feed, consisting of 0.1 g of sodium metabisulfite, 0.4 g of ammonium persulfate, 1.17 g of sodium lauryl sulfate and 20.8 g of deionized water, was added over 70 minutes. When the initial initiator and surfactant feed was finished, an identical second feed was added over an additional 70 minutes. The reaction during the feeds was exothermic and the temperature was maintained between 82° and 87° C. When the additions were finished, the monomer and initiator feed funnels were rinsed with 22.3 g and 9.4 g of deionized water respectively, and the rinses were added to the reaction mixture which was maintained at 80° C. for an additional 2½ hours. At the end of that time, the heat was shut off, the flask was cooled with a water bath and the reaction mixture, which was a blue-white emulsion, was filtered through felt to remove traces of coagulum. The emulsion had a viscosity of 40 centipoises and 48.3% solids which corresponds to a 96.6% conversion. The terpolymer had a molecular weight ($\overline{M}_w$) of about 800,000 and $T_g$ of 40° C. In this and the following examples, viscosity was measured using a Brookfield LVF viscometer, No. 1 spindle at 12 rpm at room temperature.

A 2 mil (51 μm) Kapton ® polyimide film was coated on one side with a 45 wt. % dispersion in water of an acrylic adhesive composition. The acrylic adhesive is a mixture of a terpolymer and crosslinking resin. The terpolymer is the reaction product of 35 wt. % acrylonitrile, 60 wt. % butyl acrylate and 5 wt. % glycidyl methacrylate with a molecular weight of approximately 800,000, and a $T_g$ of 40° C. To 86.2 g of terpolymer dispersion was added 2.4 g of an aqueous phenol formaldehyde resin solution (66% solids) and 8.2 g of an aqueous polyvinyl alcohol solution (4.2% solids). In this and the following examples the polyvinyl alcohol was Elvanol ® 85-80.

Using a No. 36 wire-wound rod the acrylic composition was coated and dried at 120° C. for 5 minutes. After drying, the adhesive coating was 1.0 mil (25.4 μm) thick and tack free.

EXAMPLE 2

(Low Flow Terpolymer)

In a 2 liter flask equipped with a mechanical stirrer, condenser, two addition funnels, a thermometer and nitrogen inlet were placed 380 g of deionized water, 16.4 g of acrylonitrile, 25.8 g of butyl acrylate, 4.7 g of glycidyl methacrylate and 0.01 g of ferric ammonium sulfate. This mixture was heated with stirring under a nitrogen atmosphere. When the temperature reached 73° C., an initiator solution of 0.02 g of sodium metabisulfite and 0.09 g of ammonium persulfate in 14.8 g of deionized water was added to the flask. The reaction mixture turned almost instantly into a blue-white emulsion. Right after the addition of the initiator solution, two separate feeds were begun simultaneously. The first, a monomer feed consisting of a mixture of 147.9 g of acrylonitrile, 232.4 g of butyl acrylate and 42.2 g of glycidyl methacrylate was added to the reaction mixture over 140 minutes. The second, an initiator and surfactant feed, consisted of 0.1 g of sodium metabisulfite, 0.4 g of ammonium persulfate, 1.17 g of sodium lauryl sulfate, and 20.8 g of deionized water and was added over 70 minutes. When the first initiator and surfactant feed was finished a second identical feed was added over an additional 70 minutes. The reaction during the feeds was exothermic and the temperature was maintained between 80° and 83° C. When the additions were finished, the monomer and initiator feed funnels were rinsed with 22.3 g and 9.4 g of deionized water respectively, and the rinses were added to the reaction mixture which was maintained at 82° C. for an additional two hours. At the end of that time, the heat was shut off, the flask was cooled with a water bath, and the reaction mixture, which was a blue-white emulsion, was filtered through felt to remove traces of coagulum. The emulsion had a viscosity of 45 cps and 48.5% solids which corresponds to 97% conversion.

A 2 mil (51 μm) Kapton ® polyimide film was coated on one side with a 45 wt. % dispersion in water of an acrylic adhesive composition. The acrylic adhesive was a mixture of terpolymer and crosslinking resin. The terpolymer was the reaction product of 35 wt. % acrylonitrile. 55 wt. % butyl acrylate and 10 wt. % glycidyl methacrylate having a molecular weight of approximately 800,000 and a $T_g$ of 40° C. To 90.0 g of the terpolymer dispersion was added 3.5 g of an aqueous phenol formaldehyde resin solution (66% solids) and 9.0 g of an aqueous polyvinyl alcohol solution (4.2% solids).

Using a No. 36 wire-wound rod the acrylic composition was coated and dried at 120° C. for 5 minutes. After drying, the adhesive coating was 1.0 mil (25.4 μm) thick and tack free.

EXAMPLE 3

(High Flow Terpolymer)

In a 5 liter flask, equipped with a mechanical stirrer, condenser, two addition funnels, a thermometer and nitrogen inlet were placed 1900 g of deionized water, 82 g of acrylonitrile, 129 g of butyl acrylate, 24 g of glycidyl methacrylate and 0.05 g of ferric ammonium sulfate. This mixture was heated with stirring under a nitrogen atmosphere. When the temperature reached 75° C., an initiator solution of 0.1 g sodium metabisulfite and 4.5 g of ammonium persulfate in 74 g of deionized water was added to the flask. The reaction mixture turned milky. Right after the addition of the initiator solution, two separate feeds were begun simultaneously. The first, a monomer and chain transfer feed consisting of a mixture of 739 g of acrylonitrile, 1162 g of butyl acrylate, 211 g of glycidyl methacrylate and 20 g of dodecyl mercaptan was added to the reaction mixture over 140 minutes. The second an initiator and surfactant feed, consisted of 0.5 g of sodium metabisulfite 2 g of ammonium persulfate, 20 g of sodium lauryl sulfate and 104 g of deionized water, and was added over 70 minutes. When the first initiator and surfactant feed was finished, an identical second feed was added over an additional 70 minutes. The reaction during the feeds was exothermic and maintained itself without external heat between 83° and 91° C. When the additions were finished, the monomer and initiator feed funnels were rinsed with 158 g of deionized water, and the rinses were added to the reaction mixture which was heated at 85° C. for an additional 2 hours. At the end of that time, the heat was shut off, the flask was cooled with a cold water bath, and the reaction mixture, which was a blue-white emulsion, was filtered through felt to remove traces of coagulum. The emulsion had a viscosity of 23 centipoises and 48.2% solids which corresponds to 96.4% conversion. The terpolymer had a molecular weight ($\overline{M}_w$) of about 300,000 and a $T_g$ of 40° C.

A 2 mil (51 μm) Kapton ® polyimide film was coated on one side with a 45 wt. % dispersion in water of acrylic adhesive composition. The acrylic adhesive was a mixture of a terpolymer and crosslinking resin. The terpolymer was the reaction product of 35 wt. % acrylonitrile, 55 wt. % butyl acrylate and 10 wt. % glycidyl methacrylate with a molecular weight of approximately 300,000 and a $T_g$ of 40° C. To 90.0 g of the terpolymer dispersion was added 3.5 g of an aqueous phenol formaldehyde resin solution (66% solids) and 9.0 q of an aqueous polyvinyl alcohol solution (4.2% solids).

Using a No. 36 wire-wound rod the acrylic composition was coated and dried at 120° C. for 5 minutes. After drying, the adhesive coating was 1.0 mil (25.4 μm) thick and tack free.

EXAMPLE 4

(Prior Art Composition BA/AN/MAA 60/35/5)

Same as Example 1, except that methacrylic acid was used in place of glycidyl methacrylate. This material did not exhibit the improved chemical and thermal stability of the present invention when used to prepare polyimide laminates.

EXAMPLE 5

(Prior Art Composition BA/AN/MAA 60/35/5)

Same as Example 3, except that 5% methacrylic acid was substituted for 10% glycidyl methacrylate. This material exhibited improved encapsulation and flow, but had significantly reduced chemical and thermal stability.

EXAMPLE 6

A 45% solids by weight acrylic adhesive composition was prepared from the terpolymer dispersion of Example 2.

(1) To 86.2 g of dispersion 2 was added with stirring 2.4 g of an aqueous phenol formaldehyde resin solution (66% solids) and 8.2 g of an aqueous polyvinyl alcohol solution (4.2% solids).

(2) A portion of the resulting acrylic adhesive mixture from step (1) was coated on a 2.0 mil (51 μm) thick sheet of Kapton ® polyimide film using a No. 36 wire-wound rod and then dried at 120° C. for 5 minutes. After drying, the adhesive coating was about 1.0 mil (25.4 μm) thick and tack free.

(3) The adhesive coating of (2) was overlaid with a 36 μm thick sheet of rolled-annealed treated copper and press laminated at 350° F. (177° C.) and 250 psi (17.6 kg/cm$^2$) for 60 minutes.

This produced a copper clad laminate having an adhesive strength of copper to Kapton ® film of 12 lbs/in (2.1 kg/cm) and an adhesive flow during lamination of 3 mils (76 μm). This was sufficient to encapsulate etched copper lines but low enough not to flow into pre-drilled holes in the circuit board. This laminate was floated on a solder bath at 600° F. (316° C.) for 5 minutes without blistering. After copper removal by chemical etching (aqueous ammonium persulfate/sulfuric acid), the exposed adhesive was resistant to alkaline semi-aqueous stripper (1 part J&S 732 to 3 parts water) for over 10 minutes at 150° F. (68° C.) without blistering or delamination.

EXAMPLE 7

A 45% solids by weight acrylic adhesive composition was prepared from the terpolymer dispersion of Example 3.

(1) To 90.0 g of dispersion 3 was added with stirring 3.5 g of an aqueous phenol formaldehyde resin solution (66% solids) and 9.0 g of an aqueous polyvinyl alcohol solution (4.2% solids).

(2) A portion of the resulting acrylic adhesive mixture from step (1) was coated on a 2.0 mil (51 μm) thick sheet of Kapton ® polyimide film using a No. 36 wire-wound rod and then dried at 120° C. for 5 minutes. After drying the adhesive coating was about 1.0 mil (25.4 μm) thick and tack free.

(3) The adhesive coating of (2) was overlaid with a 36 μm thick sheet of rolled-annealed treated copper and press laminated at 350° F. (177° C.), 250 psi (17.6 kg/cm$^2$) for 60 minutes.

This produced a copper clad laminate having an adhesive strength of copper to Kapton ® film of 11 5 lbs/in (2.1 kg/cm) and an adhesive flow during lamination of 18 mil (457 μm). which is sufficient to completely encapsulate the inner layers of a printed circuit without excessive resin overflow. This laminate was floated on a solder bath at 600° F. (316° C.) for 5 minutes without blistering or delamination. After copper removal by chemical etching (aqueous ammonium persulfate/sulfuric acid). the exposed adhesive was resistant to alkaline semi-aqueous resist stripper (1 part J&S 732 to 3 parts water) for 10 minutes at 150° F. (68° C.) without blistering or delamination.

EXAMPLE 8

A 45% solids by weight acrylic adhesive composition was prepared from the terpolymer dispersion of Example 3.

(1) To 90.0 g of dispersion 3 was added with stirring 3.5 g of an aqueous phenol formaldehyde resin solution (66% solids).

(2) A portion of the resulting acrylic adhesive mixture from step (1) was used to impregnate by dip coating a 2.3 mil (58.4 μm) thick sheet of Nomex ® aramid fabric and then dried at 120° C. for 5 minutes. After drying, the Nomex ® reinforced adhesive composition was about 3.7 mil (94 μm) thick and tack free.

(3) The Nomex ® reinforced adhesive composite of (2) was overlaid with a 36 μm sheet of rolled-annealed treated copper and press laminated at 350° F. (177° C.), 250 (17.6 kg/cm) psi for 60 minutes.

This produced a copper clad laminate having an adhesive strength of copper to Nomex ® of 10.5 lbs/in (1.9 kg/cm). This laminate was floated on a solder bath at 600° F. (316° C.) for 30 sec without blistering or delamination. After copper removal by chemical etching (aqueous ammonium persulfate/sulfuric acid), the exposed adhesive was resistant to alkaline semi-aqueous resist stripper (1 part Riston ®S1100 X to 3 parts water) for 5 minutes at 130° F. (54° C.) without blistering or delamination.

EXAMPLE 9

A 45% solids by weight acrylic adhesive composition was prepared from the terpolymer dispersion of Example 3.

(1) To 90.0 g of dispersion 3 was added with stirring 3.5 g of an aqueous phenol formaldehyde resin solution (66% solids).

(2) A portion of the resulting acrylic adhesive mixture from step (1) was used to impregnate by dip coating a 2.8 mil (71 μm) thick sheet of Kevlar ® aramid fabric and then dried at 120° C. for 5 minutes. After drying, the Kevlar ® fiber-reinforced adhesive composition was about 4.2 mils (107 μm) thick and tack free.

(3) The Kevlar ® fiber-reinforced adhesive composite of (2) was overlaid with a 36 μm sheet of rolled-annealed treated copper and press laminated at 360° F. (182° C.), 200 psi (14 kg/cm$^2$) for 60 minutes.

This produced a copper clad laminate having an adhesive strength of copper to Kevlar ® of 9.5 lbs/in (1.7 kg/cm). This laminate was floated on a solder bath at 550° F. (287° C.) for 5 min. without blistering or delamination. After copper removal by chemical etching (aqueous ammonium persulfate/sulfuric acid), the exposed adhesive was resistant to alkaline semi-aqueous resist stripper (1 part Riston ®S1100 X to 3 parts water) for 5 minutes at 130° F. (54° C.) without blistering or delamination.

EXAMPLE 10

Adhesive compositions were prepared using the latex compositions of Examples 1, 2, 3 and 4 (prior art) with phenolic resin and polyvinyl alcohol. Care was taken with constant stirring and slow addition to avoid polymer kick out during mixing. Samples of the adhesive compositions were coated on glass and air dried to check for cracking. All samples gave satisfactory coatings.

The adhesives were then coated on 2 mil Kapton ® supports and dried to provide samples for comparative testing. Table 1 shows comparative results of testing using standard IPC tests.

TABLE 1

| TEST SAMPLE | SOLDER RESISTANCE | 550° F. | SOLDER RESISTANCE | 600° F. | PEEL lb/in |
|---|---|---|---|---|---|
| EX. 1 | OK | 5 min | OK | 5 min | 12.1 |
| EX. 2 | OK | 5 min | OK | 5 min | 10.8 |
| EX. 3 | OK | 5 min | OK | 5 min | 10.9 |
| EX. 4 (prior art) | OK | 5 min | blister | 5 min | 10.8 |

These results illustrate the superior thermal resistance of the adhesives of the invention with equal or better peel strength.

EXAMPLE 11

The molecular weight of the terpolymer of Example 3 was varied by addition of chain transfer agent. Table 2 shows a comparison of the variation in flow which could be obtained without loss of the desirable properties of the invention.

TABLE 2

| COMPOSITION | CHAIN TRANSFER LEVEL | ADHESIVE FLOW (mils) | CAUSTIC 140° F. | SOLDER BATH - 600° F. |
|---|---|---|---|---|
| EX. 3 | 0.0 | 2.4 | 10 min | 5 min |
| EX. 3 | 0.21 | 4.3 | 12 min | 5 min |
| EX. 3 | 0.43 | 9.0 | 16 min | 5 min |
| EX. 3 | 0.85 | 16.1 | — | — |
| EX. 3 | 1.70 | 60+ | — | — |
| EX. 4 (prior art) | 0.00 | 3.3 | 4 min | 2-4 min |

EXAMPLE 12

The new adhesives of Examples 1, 2 and 3 containing GMA were compared with the prior art Example 4 containing MAA for chemical and thermal stability. Times shown in Table 3 indicate the range over which failure occurred or the limit of the test.

TABLE 3

| ADHESIVE | CAUSTIC 140° F. | STRIPPER 140° F. | SOLDER 600° F. |
|---|---|---|---|
| MAA | 4 min | 5 min | 2-4 min |
| GMA | 10-16 min | 15 min | 5-10 min |

EXAMPLE 13

Adhesive compositions were prepared as described in U.S. Pat. No. 3,822,175 comprising ethylacrylate/acrylonitrile/methacrylic acid in two different molecular weight ranges to allow a direct comparison with adhesives of the invention. Table 4 contains result of comparative testing in which the only difference in the test samples is that GMA is used instead of MAA as the comonomer for latex preparation.

TABLE 4

| ADHESIVE | MOLECULAR WT. | THERMAL STABILITY | ADHESION (PSI) |
|---|---|---|---|
| Prior Art | above 200,000 | 550° F. | 8-10 |
| Prior Art | 100,000-150,000 | below 500° F. | below 2 |
| Invention | above 200,000 | above 600° F. | 8-10 |
| Invention | 100,000-150,000 | above 600° F. | 6-8 |

Thus, the adhesive of the invention maintains superior thermal stability and shows only a slight decrease in adhesion as molecular weight is lowered to improve flow properties, whereas for the prior art adhesive at equivalent lower molecular weight there is a decrease in thermal stability and an unacceptable decrease in adhesion. It has been a significant invention to discover an adhesive composition with desirable flow properties without the loss of adhesion and thermal stability. Satisfactory, low flow compositions had not been evident prior to the invention.

Glossary of Tradenames

The following are tradenames of E. I. du Pont de Nemours and Company, Inc., Wilmington, Del. for the indicated materials.

Elvanol ®; Polyvinyl alcohol
Kapton ®; Polyimide film
Kevlar ®; Aramid fiber
Mylar ®; Polyester film
Nomex ®; Aramid fiber and sheet material Riston ®; Photopolymer resist equipment and stripping agents.

Shodex ® is a tradename of Water's Associates, Milford, Mass. for polystyrene-based chromatographic separation materials.

J&S 732 is a tradename of J&S Laboratories, Los Angeles, Calif. for alkaline aqueous glycol ether/alkanolamine mixtures.

We claim:

1. A latex copolymer prepared by free radical-initiated aqueous emulsion polymerization of a mixture of nonacidic monomers consisting essentially of 50–60 wt. % $C_{1-4}$ alkyl acrylate, 30–40 wt. % acrylonitrile, methacrylonitrile or mixtures thereof, and 5–12 wt. % glycidyl acrylate, glycidyl methacrylate or mixtures thereof, having a $T_g$ of 0°–55° C. and a weight average molecular weight of 150,000–450,000.

2. The polymer of claim 1 in which weight average molecular weight is 150,000–300,000.

3. The copolymer of claim 1 having a $T_g$ of 0°–40° C.

* * * * *